United States Patent
Sonoda

(10) Patent No.: US 8,081,533 B2
(45) Date of Patent: Dec. 20, 2011

(54) SEMICONDUCTOR MEMORY DEVICE

(75) Inventor: Masatoshi Sonoda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 128 days.

(21) Appl. No.: 12/652,362

(22) Filed: Jan. 5, 2010

(65) Prior Publication Data

US 2010/0195429 A1 Aug. 5, 2010

(30) Foreign Application Priority Data

Feb. 3, 2009 (JP) .................. 2009-022763

(51) Int. Cl.
*G11C 7/00* (2006.01)

(52) U.S. Cl. ............ 365/222; 365/194; 365/233.1; 365/149; 365/150; 365/186; 365/189.011; 365/233.12

(58) Field of Classification Search .......... 365/222, 365/194, 233.1, 149, 150, 189.011, 186, 365/233.12
See application file for complete search history.

(56) References Cited

U.S. PATENT DOCUMENTS

| 6,876,592 | B2 | 4/2005 | Takahashi et al. | |
| 6,981,187 | B1 * | 12/2005 | Oh | 714/718 |
| 7,200,059 | B2 * | 4/2007 | Fujioka et al. | 365/201 |
| 7,505,346 | B2 * | 3/2009 | Kobayashi | 365/207 |
| 7,652,941 | B2 * | 1/2010 | Mori et al. | 365/203 |

FOREIGN PATENT DOCUMENTS

JP 3376998 B2 12/2002

* cited by examiner

*Primary Examiner* — Fernando N. Hidalgo
(74) *Attorney, Agent, or Firm* — Foley & Lardner LLP

(57) ABSTRACT

A semiconductor memory device is provided between a refresh request circuit and a command decoder, and includes a refresh synchronous circuit for deactivating a refresh request if an external access request is output from the command decoder. The semiconductor memory device further includes a clock phase adjusting unit that generates a delay to a clock, where the delay is same or longer than the time taken from when the external access request is issued until when a critical path is passed, and the delay is also shorter than one cycle. Then a flip-flop retrieves the request from the command decoder at the clock timing from the clock phase adjusting unit to supply it to the memory cell array.

5 Claims, 7 Drawing Sheets

SEMICONDUCTOR MEMORY DEVICE

INCORPORATION BY REFERENCE

This application is based upon and claims the benefit of priority from Japanese patent application No. 2009-022763, filed on Feb. 3, 2009, the disclosure of which is incorporated herein in its entirety by reference.

BACKGROUND

1. Field of the Invention

The present invention relates to an increase in the access speed of a synchronous pseudo SRAM.

2. Description of Related Art

A pseudo SRAM is well known in the art. The pseudo SRAM has the same interface as an SRAM using a memory cell of a DRAM of a related art. That is, the pseudo SRAM includes a refresh control built into a memory, and a controller performs only a read/write control.

Since the pseudo SRAM uses DRAM, which is considered to be unfavorable in terms of speed, for the memory cell and peripheral circuits are integrated, the access speed of the pseudo SRAM is less than SRAM and also genuine DRAM. On the other hand, the pseudo SRAM has advantages of low cost per area and high volume.

Using such advantages, the pseudo SRAMs have often been used in the field of mobile applications that requires cheap and high volume but not high speed accesses.

However in recent years, even in the field that requires high speed accesses, such as network devices, memories are increasing their volumes, so that a DRAM core is required.

Existing SRAMs should be replaced with high volume memories to respond to this demand, however there is an increasing request to speed up the pseudo SRAMs.

There is a limitation in the configuration of the pseudo SRAM that a memory cannot expect when a read/write command will arrive. Therefore, it is necessary to prohibit a refresh operation at the same time as receiving the command, and wait for the refresh to be completed, and then start a read operation.

For example, Japanese Patent No. 3376998 discloses an address access method that operates a semiconductor memory device using a DRAM cell as a general (asynchronous) SRAM.

FIG. 7 is a timing chart according to one exemplary embodiment of Japanese Patent No. 3376998.

The timing chart illustrates an operation of immediately executing a refresh internally in response to a read/write request received from outside, and then performing the read/write request.

In this case, there is a problem that the start of the read operation is delayed by the waiting time for the refresh operation, and thereby slowing down the access. Further, in order to prevent from an internal competition between the refresh and read/write operation, it is necessary to control not to start a new refresh after receiving the read/write command.

Thus, it is desired to remain a pseudo SRAM interface that requires no refresh control and also to increase the speed of accesses.

SUMMARY

In order to simply eliminate the refresh control, it can be considered to apply the concept of Japanese Patent No. 3376998 to the synchronous pseudo SRAM.

A case is described here, in which the concept of Japanese Patent No. 3376998 is simply applied to the synchronous pseudo SRAM.

FIG. 5 illustrates a configuration example of applying the concept of Japanese Patent No. 3376998 to the synchronous pseudo SRAM.

In FIG. 5, an externally input clock passes through a delay device to be an internal clock. Then, commands 0 to N are latched by a flip-flop ($FF_0$) with the internal clock. Then the commands 0 to N are processed by a command decoder 110, and then supplied to a DRAM core 200.

A refresh request signal is not directly input to the command decoder 110, but passes through the AND circuit with inverted input 120 and the flip-flop ($FF_1$) to be input to the command decoder. That is, the refresh request signal is input to a positive input of the AND circuit with inverted input 120 and an internal read command is input to the inverted input. An output from the AND circuit with inverted input 120 is input to the command decoder 110.

Accordingly the internal read command deactivates the refresh request signal. Then, if the read command is received, refresh operations afterward will be prohibited.

In this way, a refresh synchronous circuit is composed by the AND circuit with inverted input 120.

FIG. 6 is a timing chart of the control according to FIG. 5 in a product of a row cycle ($t_{RC}$)=access($t_{RAC}$)=4 cycles.

Suppose that a read command is received at the cycle 1. Then, it is possible to recognize that a read command is received from the output of the command decoder 110, thus refresh operations to be started in and after the cycle 2 can be prohibited.

However, the latest refresh operation could start from an edge of cycle 1 of the internal clock. In such case, wait for the refresh period from the edge, generate an internal read command, and data read out is output to an external terminal. FIG. 6 illustrates such case with the latest timing.

According to FIG. 6, an access from when a read command is received to a data output is determined by a total of;

{(1) internal clock delay}+{(2) refresh period}+{(3) data output}

Generally in a pseudo SRAM, an internal refresh period and a read period are specified to be $t_{RC}/2$, thus the random access time $t_{RAC}$ from the read command is represented by;

$$\{(1) \text{ internal clock delay}\}+t_{RC}/2+\{(3) \text{ data output}\} \quad \text{Formula (1)}$$

Thus, there is a considerable delay.

It seems that by prohibiting a refresh in the cycle "1" enables to move forward the refresh timing, which is to be executed last, by one cycle and this contributes higher speed.

However, such control will not make any difference from prohibiting a refresh in the cycle "5".

Accordingly, the present inventor has found a problem that continuous read/write accesses will shut out any refresh operation.

An exemplary aspect of an embodiment of the present invention is a semiconductor memory device that includes a memory cell array having a plurality of memory cells for storing data, a refresh request circuit that internally generates a refresh request, where the refresh request requests a refresh operation of the memory cells, a command decoder that decodes an external access request and the refresh request and supplies to the memory cell, where the external access request requests an access to the memory cells from outside, a refresh synchronous circuit that is provided between the refresh request circuit and the command decoder and deactivates the refresh request if the external access request is output from the command decoder, a clock phase adjusting unit that generates a delay to a clock, where the delay is same or longer than time taken since the external access request is generated until the external access request passes through the command decoder and the refresh synchronous request synchronized with the external access request is supplied to the memory cells, and the delay is shorter than one cycle, and a flip-flop that is provided between the command decoder and the memory cell array, retrieves a request from the command decoder at a clock timing from the clock phase adjusting unit, and supplies to the memory cell array.

In such configuration, the timing to decode and retrieve an external access request is delayed by the clock phase adjusting unit for the phase adjusting clock. Then, the delay of the phase adjusting clock is taken only for the time necessary to synchronize the refresh request with an external command (for example a read command) and deactivate it.

Then the refresh request can be deactivated from the timing of the phase adjusted clock with the same cycle as when an external access request is supplied. The cycle to prohibit the refresh operation can be faster by the delay of the phase adjusting clock. Therefore, the waiting time for the refresh period can be reduced and thereby reducing the random access time as a result. This enables to speed up the access time of the semiconductor memory device.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention are described hereinafter with reference to the drawings.

First Exemplary Embodiment

Figure 1:
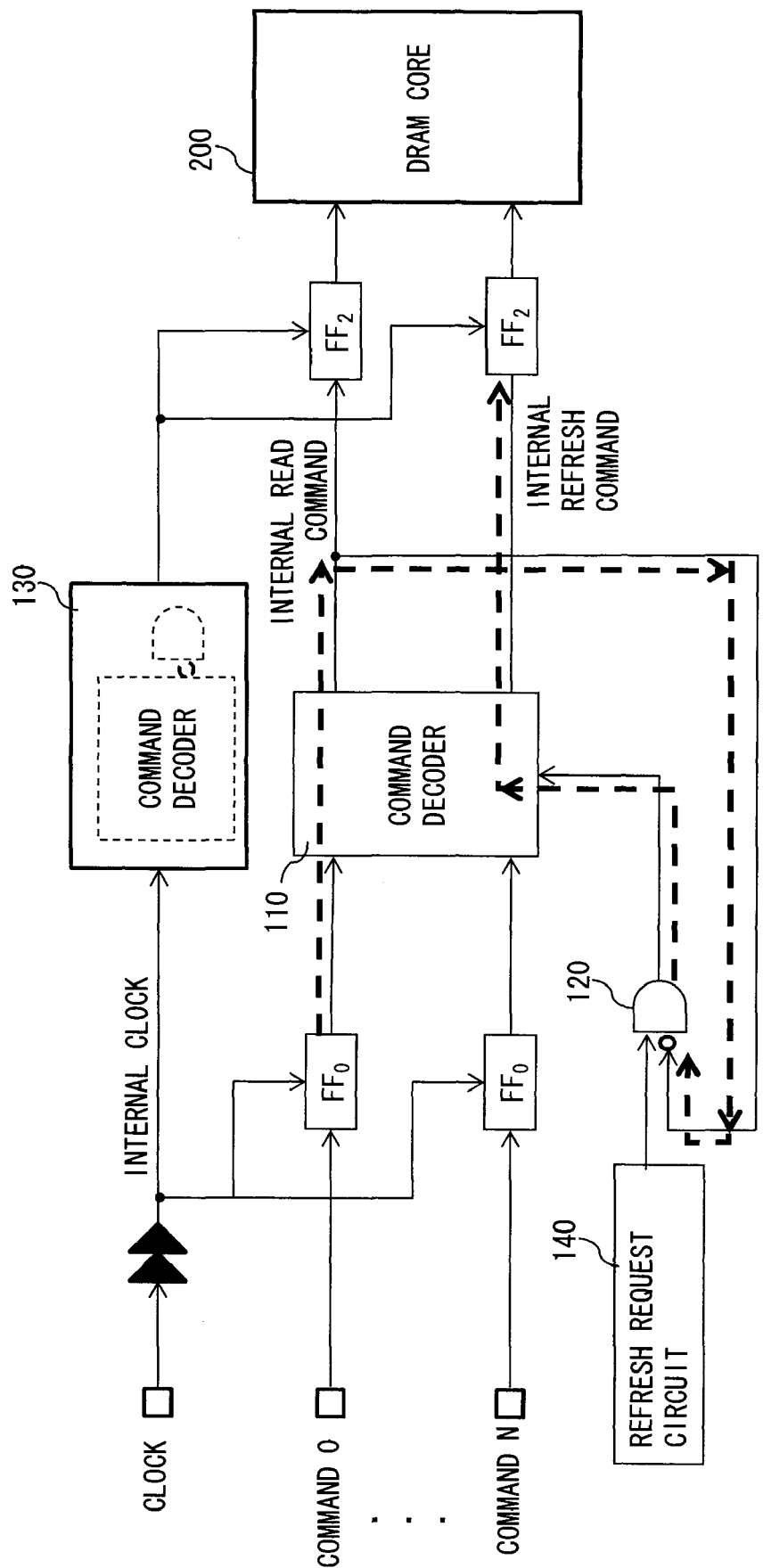
FIG. 1 is a block diagram illustrating the configuration of a synchronous pseudo SRAM according to a first exemplary embodiment.

FIG. 1 is a block diagram illustrating the configuration of a synchronous pseudo SRAM according to a first exemplary embodiment.

Figure 5:
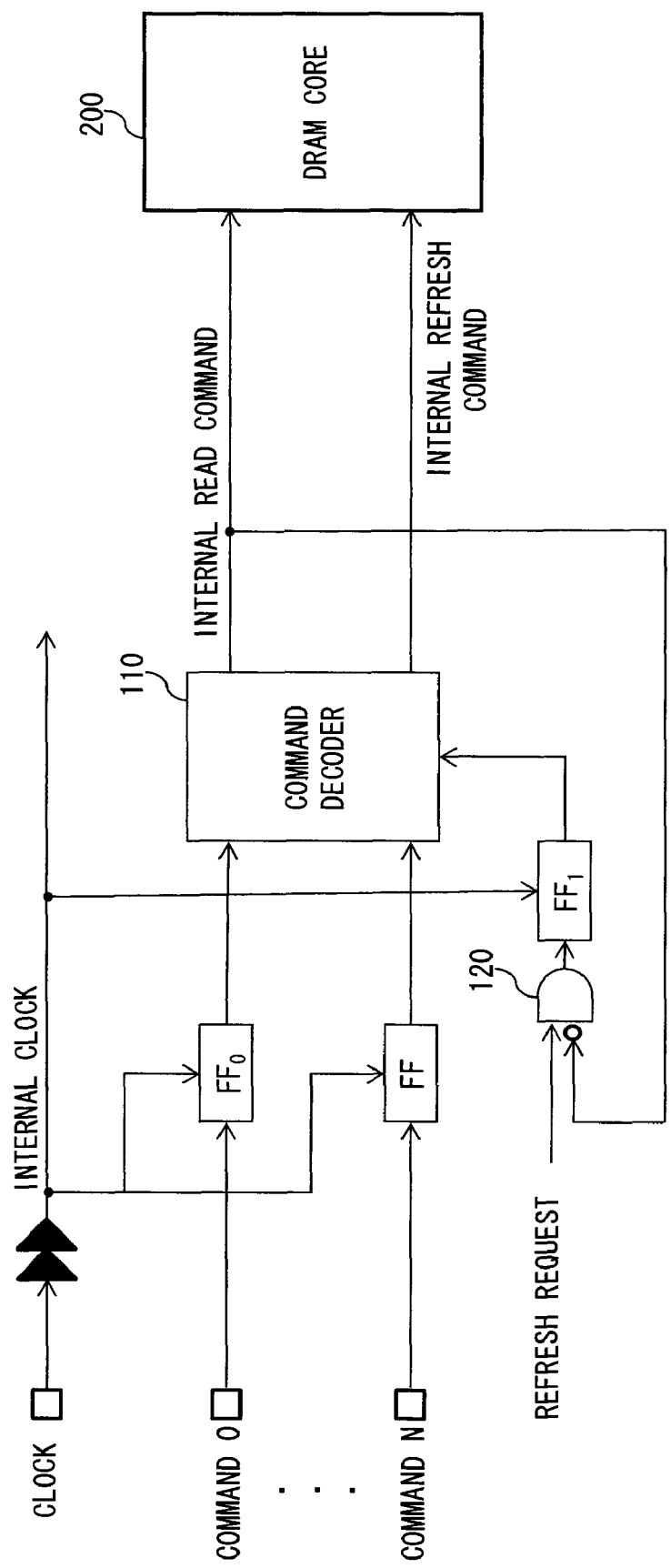
FIG. 5 is a block diagram in case of simply applying the concept of Japanese Patent No. 3376998 to a synchronous pseudo SRAM.
Figure 6:
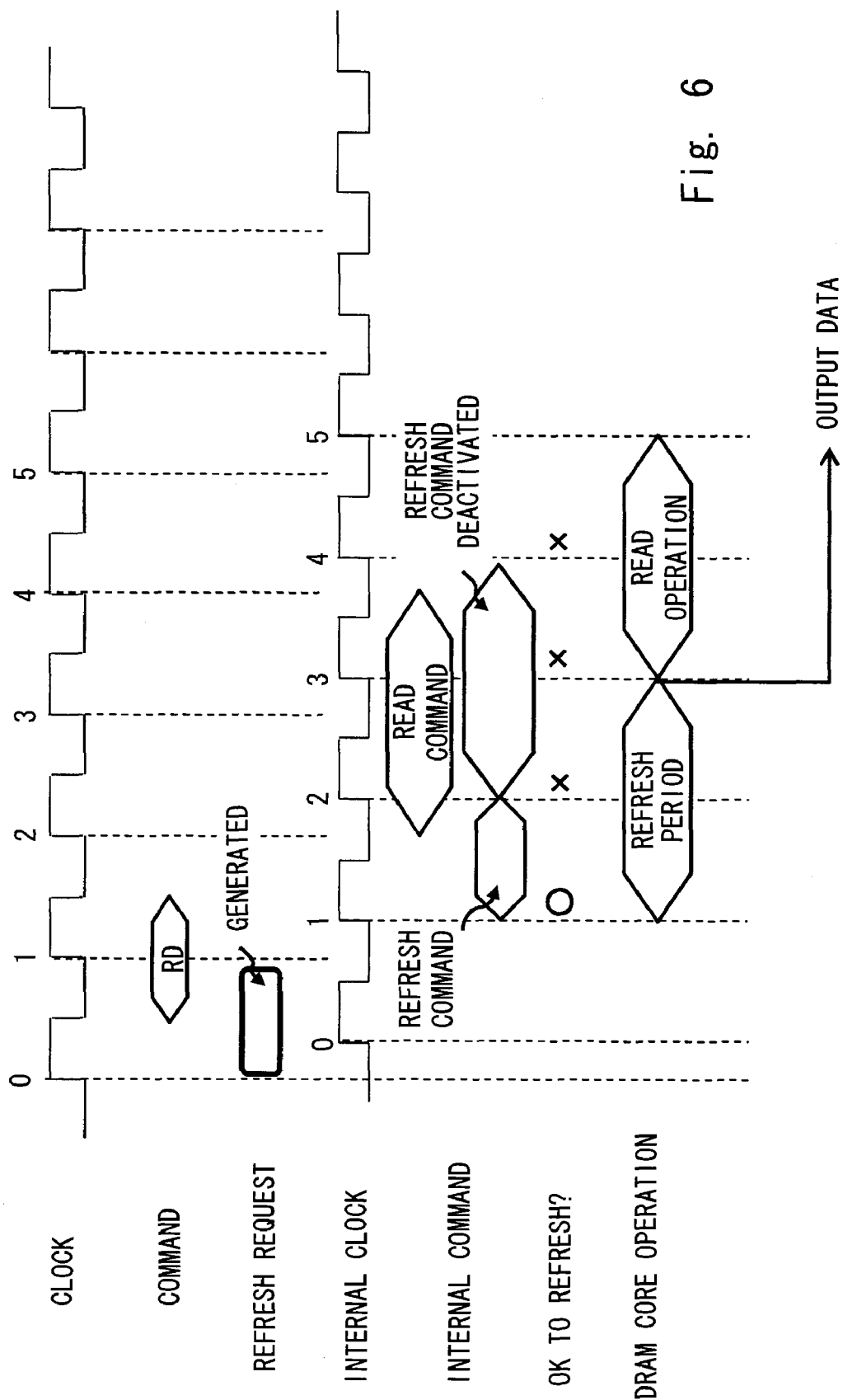
FIG. 6 is a timing chart of the control according to FIG. 5 in the product of a row cycle ($t_{RC}$)=access ($t_{RAC}$)=4 cycles.
Figure 7:
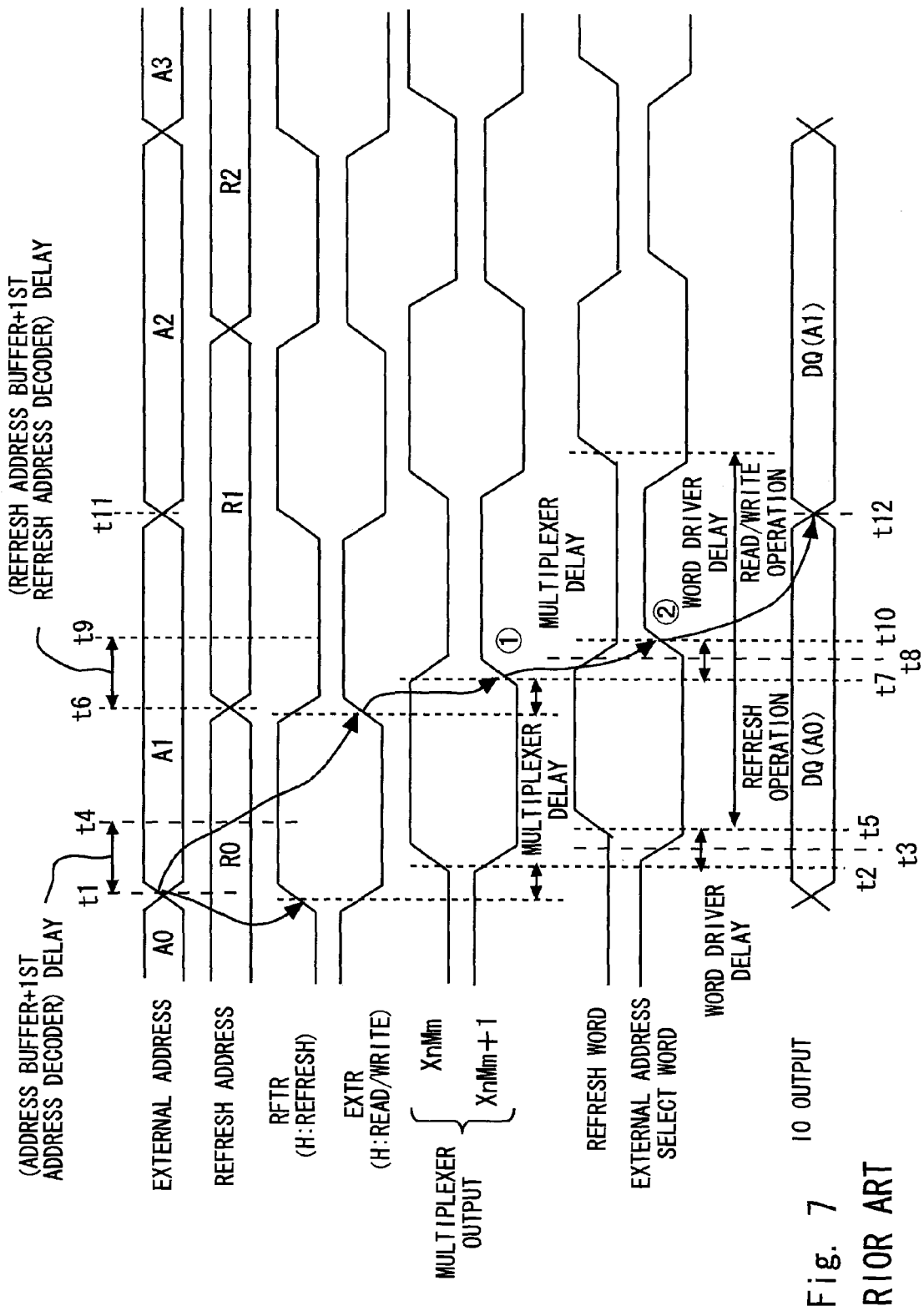
FIG. 7 is a timing chart according to an exemplary embodiment of a related art.

In FIG. 1, same components as FIG. 5 are denoted by the same symbols therein.

To explain the problem, the case of simply applying the concept of Japanese Patent No. 3376998 to a synchronous pseudo SRAM is explained with reference to FIG. 5.

In this exemplary embodiment as compared to FIG. 5, the synchronous pseudo SRAM includes a flip-flop ($FF_2$) for latching an output signal (internal command) of the command decoder 110, and a phase clock adjusting unit 130 for adjusting a phase of a clock signal to the flip-flop ($FF_2$).

The clock phase adjusting unit 130 includes replica circuits of the command decoder 110 and a refresh request logic (120).

Accordingly, the clock phase adjusting unit 130 delays an internal clock by the same or longer period than the delay of a critical path of a command generated, which is indicated by dotted arrows in FIG. 1.

The clock phase adjusting unit 130 is inserted between the internal clock and the flip-flop $FF_2$, and supplies the delayed clock (phase adjusted clock) to the flip-flop $FF_2$.

The flip-flop $FF_2$ is controlled by the phase adjusted clock output from the clock phase adjusting unit 130.

With such configuration, the DRAM core 200 is controlled by a command, which is retrieved by a clock (phase adjusted clock) delayed in the critical path from the internal clock.

The operation of the first exemplary embodiment provided with the above-mentioned configuration is explained hereinafter.

Figure 2:
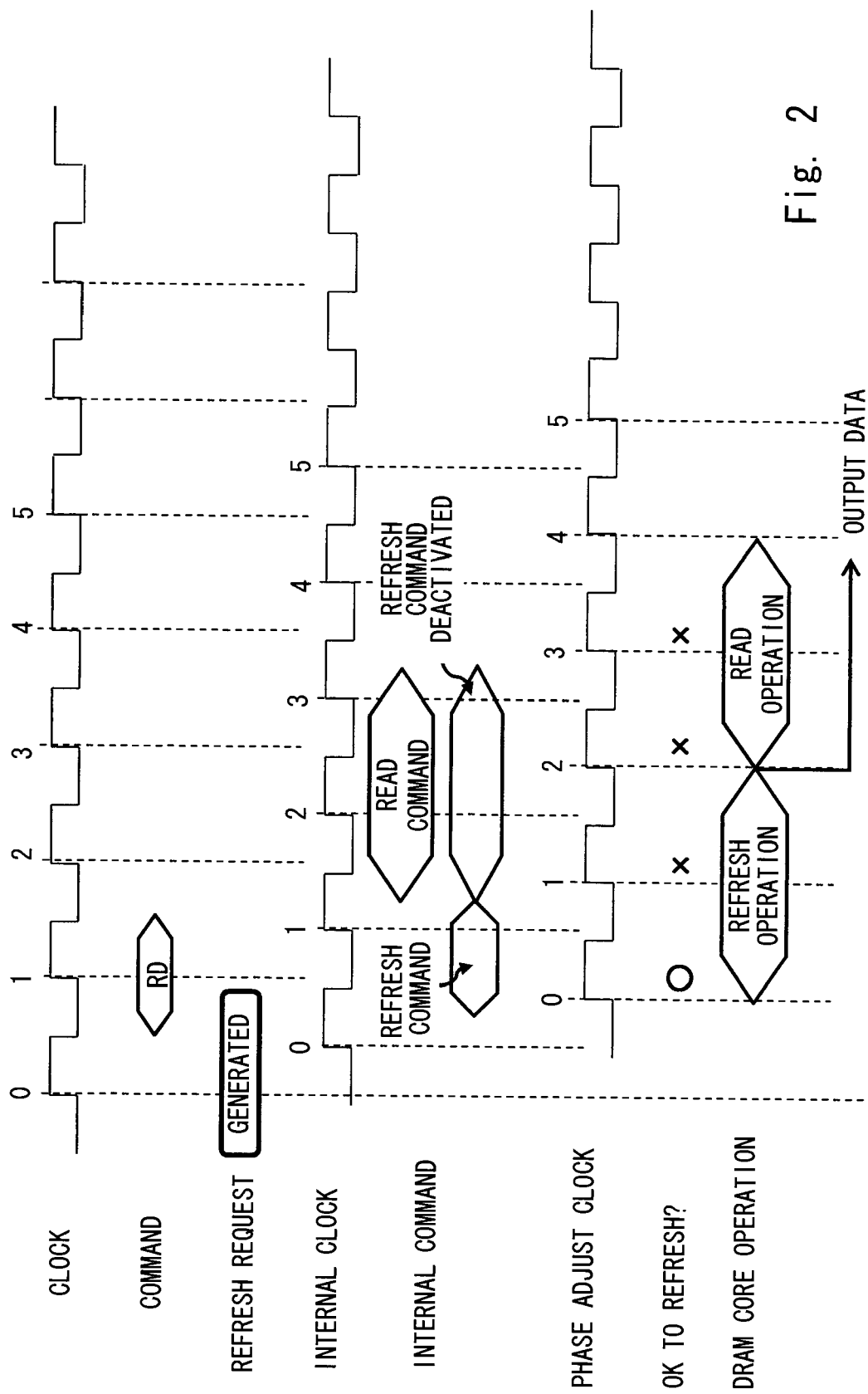
FIG. 2 is a timing chart illustrating an operation in case of receiving a read command after starting a refresh.
Figure 3:
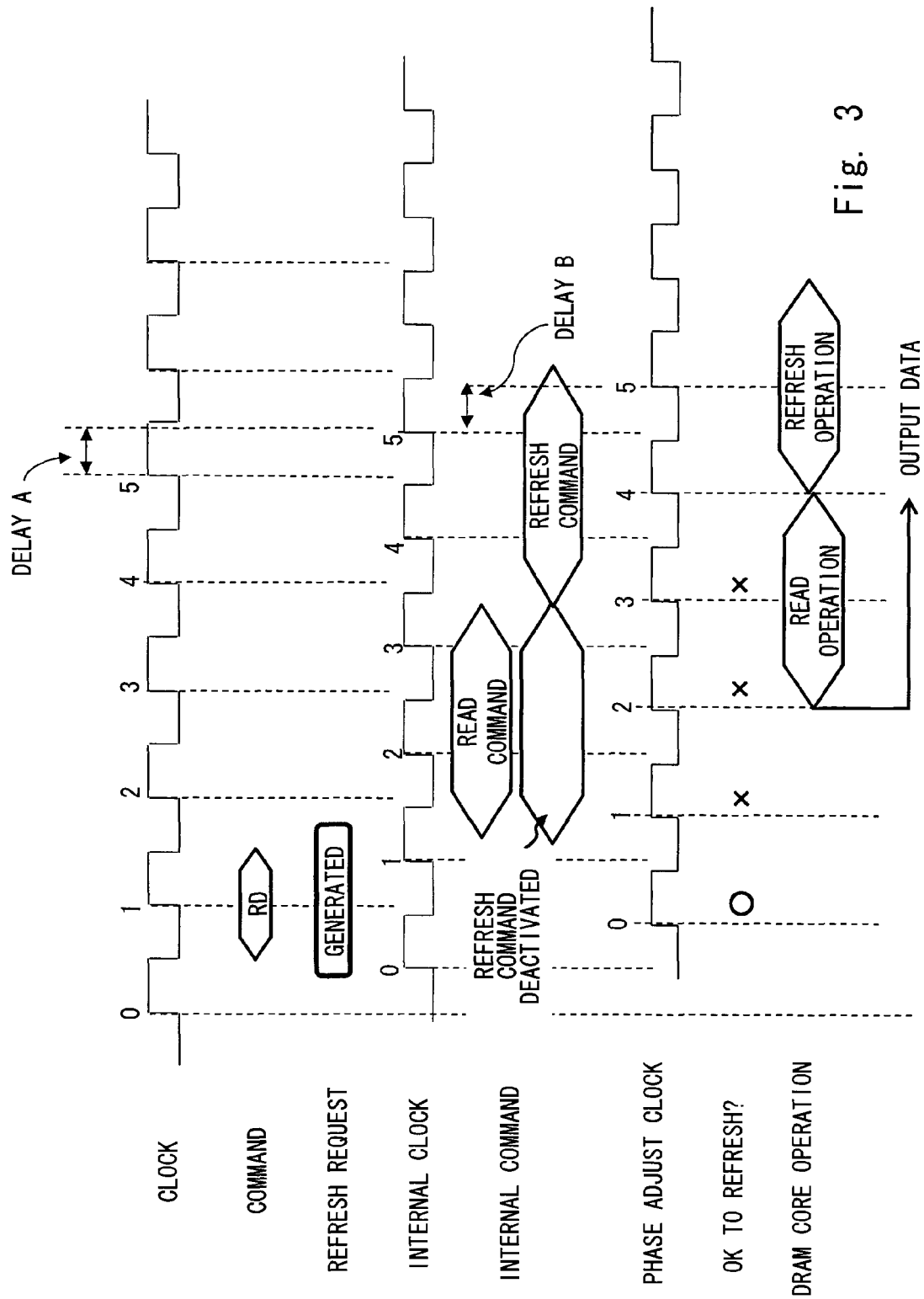
FIG. 3 is a timing chart illustrating an operation in case of receiving a refresh request and a read command at the same time.

FIGS. 2 and 3 are timing charts in case of mounting a product of $t_{RC}=t_{RAC}=4$ clocks.

FIG. 2 is a timing chart illustrating an operation in case of receiving a read command after starting (1) refresh.

FIG. 3 is a timing chart illustrating an operation in case of receiving (2) refresh request and a read command at the same time.

An operation in case of receiving a read command after starting (1) refresh is described with reference to FIG. 2.

A case is described as an example, in which a refresh request is internally generated from a refresh request circuit 140 at the cycle 0, and a read command is externally supplied at the cycle 1.

First, a refresh request is internally generated at the cycle 0.

The cycle 0 to receive the refresh request is an NOP (non operation) command (meaning that a read command is not generated).

The NOP command retrieved with the internal clock passes through the command decoder 110.

The NOP command should be input to the inverted input of the AND circuit with inverted input 120, however in this example the refresh request is output as is and supplied to the command decoder 110.

Therefore, an internal refresh command is delayed in the critical path indicated by the arrows in FIG. 1, and supplied to a data terminal of the flip-flop ($FF_2$).

This internal refresh command is latched by the $FF_2$.

At this time, the flip-flop ($FF_2$) latches this internal refresh command with the phase adjusted clock.

By the clock phase adjusting unit 130, the phase adjusted clock is slightly slower than the delay of the critical path.

Accordingly, in this case, a refresh start is specified to the DRAM core 200 at the timing delayed by the timing of the phase adjusted clock from the internal clock.

Then a read command is externally input at the cycle 1.

This read command is output to the flip-flop ($FF_2$) via the command decoder 110.

The flip-flop ($FF_2$) latches this read command at the timing "1" of the phase adjusted clock.

The refresh operation of the DRAM core 200 starts from "0" of the phase adjusted clock.

Therefore, a read operation of the DRAM core 200 starts from the phase adjusted clock "2", when a half of the random cycle time ($t_{RC}/2$) has passed, and data retrieved by the read operation is output.

At the same time, an internal read command is input to the inverted input of the AND circuit with inverted input 120. This deactivates the internal refresh command, which is to be generated with the refresh request as a trigger. Therefore, the internal refresh command in and after the phase adjusted clock "1" is deactivated.

As described so far, the synchronous pseudo SRAM of this exemplary embodiment is provided with the clock phase adjusting unit 130 and delays the timing to decode and retrieve an external command by the period of the phase adjusted clock from the internal clock.

Then, the delay of the phase adjusting clock is taken only for the time necessary to synchronize the refresh request with an external command (for example a read command) and deactivate it.

Accordingly, the refresh request can be deactivated from the timing of the phase adjusted clock with the same cycle as when an external access request is supplied.

The cycle to prohibit the refresh operation can be faster by the delay of the phase adjusting clock. Therefore, the waiting time for the refresh period can be reduced, and thereby reducing the random access time ($t_{RAC}$) as a result.

Next, a case is described hereinafter, in which (2) refresh request and a read command are received at the same time, with reference to FIG. 3.

In this case, a refresh request and a read command are generated at the same time at the cycle 1.

The read command supplied at the cycle 1 is retrieved at the cycle 1 of the internal clock, passes through the critical path of FIG. 1, and reaches the flip-flop (FF).

The internal read command which has reached the flip-flop (FF) is latched at the cycle 1 of the phase adjusted clock.

Further, the internal read command is input to the inverted input of the AND circuit with inverted input 120. This deactivates the internal refresh command, which is to be generated with the refresh request as a trigger.

By such operation, a read operation of the DRAM core 200 starts at the edge of the phase adjusted clock "2".

As described so far, in this exemplary embodiment, in both cases of FIGS. 2 and 3, the read command are received at the cycle 1 and the read operation of the DRAM core 200 can be started from the phase adjusted clock "2".

As the random cycle time ($t_{RC}$) in this exemplary embodiment is 4 clock cycles, the delay of the phase adjusted clock "1" to "2" is $t_{RC}/4$.

Accordingly, the random access time ($t_{RAC}$) from the read command is;

$$\{(1)'\text{ clock delay equivalent}\} + (t_{RC}/4) + \{(3)\text{ data output}\} \quad \text{Formula (2)}$$

The $\{(1)'$ clock delay equivalent$\}$ is a delay of the internal clock (delay A)+delay of the phase adjusted clock (delay B).

The effect of speedup in the random access time $t_{RAC}$ when comparing this formula (2) with the formula (1) is;

$$\text{Formula (1)}-\text{Formula (2)} = ((1)-(1)') + t_{RC}/4 \quad \text{Formula (3)}$$

In this formula, $\{(1)-(1)'\}$ is the delay of the critical path of FIG. 1. This delay is usually much less than a clock cycle ($=t_{RC}/4$), which is a basic of the synchronous circuit design.

As a typical example, in case of $t_{RAC}=t_{RC}=20$ ns and a delay of the critical path is 2 ns, the formula (3) is $-2$ ns$+20$ ns$/4=3$ ns.

Accordingly in this case, by applying this exemplary embodiment, the random access time can be faster by 3 ns.

In the configuration of a related art, $t_{RAC}=20$ ns, and in this exemplary embodiment, $t_{RAC}=17$ ns, thereby achieving 15% speed-up.

Second Exemplary Embodiment

Next, a second exemplary embodiment of the present invention is described hereinafter.

The basic configuration of the second exemplary embodiment is same as the first exemplary embodiment, except that the phase adjusting unit is composed of a DLL (DLL: Delay Locked Loop) circuit 150.

Figure 4:
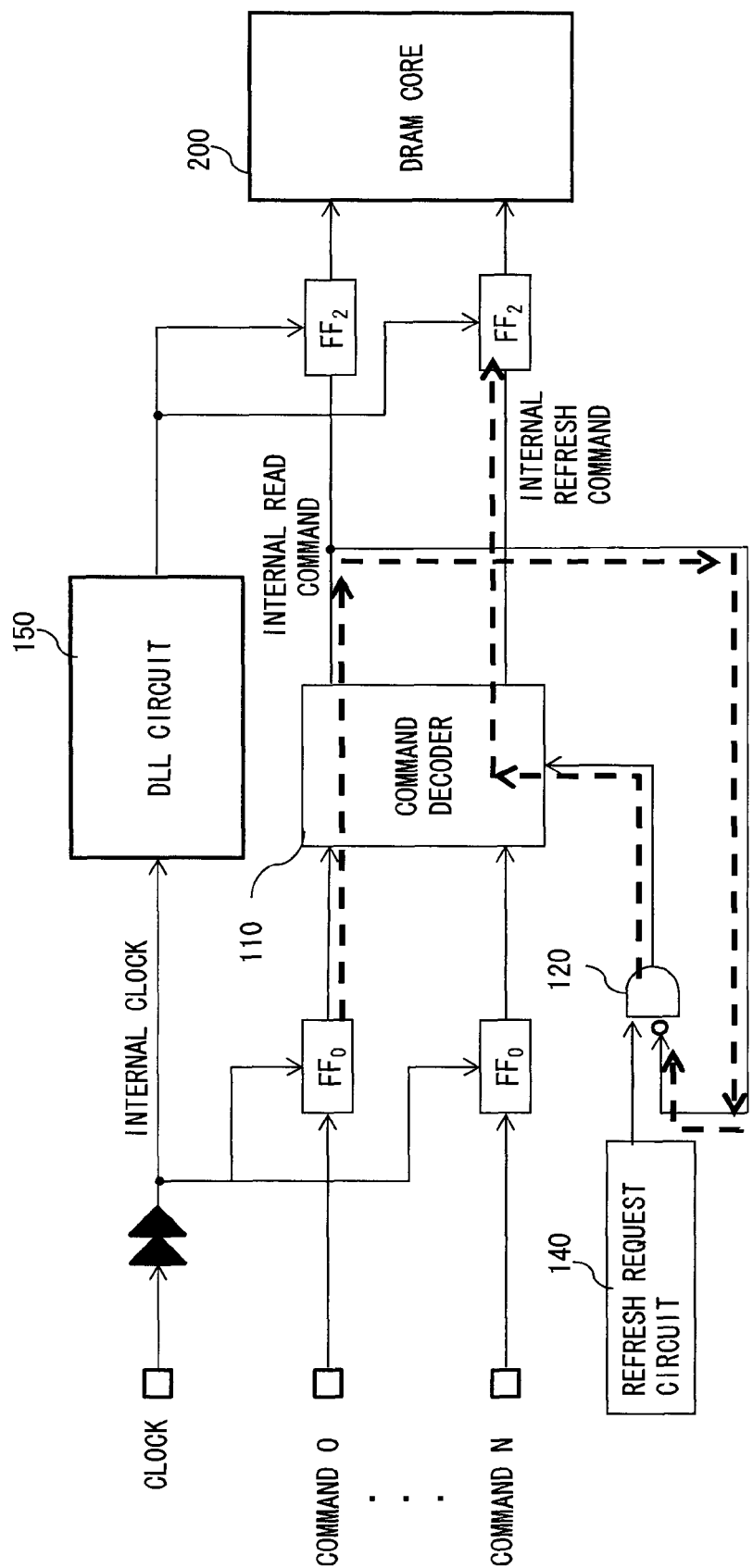
FIG. 4 is a block diagram illustrating the configuration of a second exemplary embodiment.

FIG. 4 is a block diagram illustrating the configuration of the second exemplary embodiment.

In the first exemplary embodiment (FIG. 1), the replica circuits are used to determine a generation timing of the phase adjusted clock. In the second exemplary embodiment, the DLL 150 is used to compose the phase adjusting unit.

In such configuration, the DLL 150 specifies the amount of clock delay as appropriate.

Specifically, the DLL 150 specifies the delay to be the same or larger than the delay time of the critical path.

As the DLL is used to generate a clock, for example when attempting to ensure a larger latch margin of an internal command for a low frequency product grade or when attempting to ease the timing design by clarifying a timing relationship with other circuits, timings of the phase adjusted clock can be adjusted as appropriate by a means such as trimming a fuse.

An operation of the second exemplary embodiment is same as the first exemplary embodiment except that the adjustment of the phase adjusting clock is performed by a DLL.

The present invention is not limited to the above exemplary embodiments, but can be modified as appropriate within the scope of the present invention.

For example, as for the phase adjusting unit, beside the abovementioned configuration including the replica circuits and the DLL circuit, a PLL circuit may be included, and a clock to be supplied to the flip-flop (FF) may be delayed for the internal clock by shifting the clock phase or extending the cycle of the clock.

The first and the second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory device comprising:
   a memory cell array having a plurality of memory cells for storing data;
   a refresh request circuit that internally generates a refresh request, the refresh request requesting a refresh operation of the memory cells;
   a command decoder that receives and decodes an external access request and the refresh request and supplies to the memory cell, the external access request requesting an access to the memory cells from outside;

a refresh synchronous circuit that is provided between the refresh request circuit and the command decoder and deactivates the refresh request if the external access request is output from the command decoder;

a clock phase adjusting unit that generates a delay to a clock, the delay being same or longer than time taken since the external access request is received until the external access request passes through the command decoder and the refresh request synchronized with the external access request by the refresh synchronous circuit is supplied to the memory cells, and the delay being shorter than one clock cycle; and a flip-flop that is provided between the command decoder and the memory cell array, retrieves the external access request from the command decoder at a clock timing from the clock phase adjusting unit, and supplies to the memory cell array.

2. The semiconductor memory device according to claim 1, wherein the clock phase adjusting unit comprises a replica circuit of the command decoder.

3. The semiconductor memory device according to claim 2, wherein the replica circuit further comprises the refresh synchronous circuit.

4. The semiconductor memory device according to claim 1, wherein the clock phase adjusting unit is composed of a DLL circuit.

5. The semiconductor memory device according to claim 1, wherein the clock phase adjusting unit is composed of a PLL circuit.

* * * * *